United States Patent
Shih et al.

(10) Patent No.: US 7,458,012 B2
(45) Date of Patent: Nov. 25, 2008

(54) METHOD FOR DETECTING CODE ERROR

(75) Inventors: Tung-Ho Shih, Hsin-Tien (TW); Tung-Chih Kuo, Hsin-Tien (TW)

(73) Assignee: Via Technologies Inc., Taipei County (TW)

( * ) Notice: Subject to any disclaimer, the term of this patent is extended or adjusted under 35 U.S.C. 154(b) by 551 days.

(21) Appl. No.: 11/329,164

(22) Filed: Jan. 11, 2006

(65) Prior Publication Data
US 2007/0074094 A1 Mar. 29, 2007

(30) Foreign Application Priority Data
Sep. 23, 2005 (TW) .............. 94132970 A

(51) Int. Cl.
*H03M 13/00* (2006.01)
*G06F 11/00* (2006.01)

(52) U.S. Cl. .................................... 714/819

(58) Field of Classification Search ......... 714/799–801, 714/807–808, 819
See application file for complete search history.

(56) References Cited

U.S. PATENT DOCUMENTS

| | | | | |
|---|---|---|---|---|
| 4,608,693 A | * | 8/1986 | Baranyai et al. | 714/801 |
| 5,121,397 A | * | 6/1992 | Norrod | 714/808 |
| 7,089,481 B2 | * | 8/2006 | D'Arcy et al. | 714/794 |

* cited by examiner

*Primary Examiner*—Shelly A Chase
(74) *Attorney, Agent, or Firm*—Rosenberg, Klein & Lee

(57) ABSTRACT

A method for detecting a code error is proposed. The method is mainly applied for detecting whether there is a code error existed in the accessed data, in other words, for detecting whether there is only an error bit existed in the accessed data. After the data are accessed, the method generates an error comparison code correspondingly. Then, the method adds up each bit of the error comparison code to provide a summation value. After that, the method checks whether a carrying operation occurs and checks whether the summation value is equal to "1" when no carrying operation occurs. If no carrying operation occurs and the summation value is equal to "1", the method determines that there is only an error bit existed in the accessed data. Thereby, the code errors are detected speedily and the number of the components for detection and the occupied area are reduced.

15 Claims, 6 Drawing Sheets

| Input | | | | Output | | | | | |
|---|---|---|---|---|---|---|---|---|---|
| [0] | [1] | [2] | [3] | S1 | S2 | S3 | C1 | C2 | Y |
| 0 | 0 | 0 | 0 | 0 | 0 | 1 | 0 | 0 | 0 |
| 0 | 0 | 0 | 1 | 0 | 1 | 0 | 0 | 0 | 1 |
| 0 | 0 | 1 | 0 | 0 | 1 | 0 | 0 | 0 | 1 |
| 0 | 0 | 1 | 1 | 0 | 1 | 0 | 0 | 1 | 0 |
| 0 | 1 | 0 | 0 | 1 | 0 | 0 | 0 | 0 | 1 |
| 0 | 1 | 0 | 1 | 1 | 1 | 1 | 0 | 0 | 0 |
| 0 | 1 | 1 | 0 | 1 | 1 | 1 | 0 | 0 | 0 |
| 0 | 1 | 1 | 1 | 1 | 1 | 1 | 0 | 1 | 0 |
| 1 | 0 | 0 | 0 | 1 | 0 | 0 | 0 | 0 | 1 |
| 1 | 0 | 0 | 1 | 1 | 1 | 1 | 0 | 0 | 0 |
| 1 | 0 | 1 | 0 | 1 | 1 | 1 | 0 | 0 | 0 |
| 1 | 0 | 1 | 1 | 1 | 1 | 1 | 0 | 1 | 0 |
| 1 | 1 | 0 | 0 | 1 | 0 | 0 | 1 | 0 | 0 |
| 1 | 1 | 0 | 1 | 1 | 1 | 1 | 1 | 0 | 0 |
| 1 | 1 | 1 | 0 | 1 | 1 | 1 | 1 | 0 | 0 |
| 1 | 1 | 1 | 1 | 1 | 1 | 1 | 1 | 1 | 0 |

Fig. 2B

| Input | | | | Output | | | | | |
|---|---|---|---|---|---|---|---|---|---|
| [0] | [1] | [2] | [3] | S1 | S2 | S3 | C1 | C2 | Y |
| 0 | 0 | 0 | 0 | 0 | 1 | 1 | 0 | 0 | 0 |
| 0 | 0 | 0 | 1 | 0 | 0 | 0 | 0 | 0 | 1 |
| 0 | 0 | 1 | 0 | 0 | 0 | 0 | 0 | 0 | 1 |
| 0 | 0 | 1 | 1 | 0 | 0 | 0 | 0 | 1 | 0 |
| 0 | 1 | 0 | 0 | 1 | 1 | 0 | 0 | 0 | 1 |
| 0 | 1 | 0 | 1 | 1 | 0 | 1 | 0 | 0 | 0 |
| 0 | 1 | 1 | 0 | 1 | 0 | 1 | 0 | 0 | 0 |
| 0 | 1 | 1 | 1 | 1 | 0 | 1 | 0 | 1 | 0 |
| 1 | 0 | 0 | 0 | 1 | 1 | 0 | 0 | 0 | 1 |
| 1 | 0 | 0 | 1 | 1 | 0 | 1 | 0 | 0 | 0 |
| 1 | 0 | 1 | 0 | 1 | 0 | 1 | 0 | 0 | 0 |
| 1 | 0 | 1 | 1 | 1 | 0 | 1 | 0 | 1 | 0 |
| 1 | 1 | 0 | 0 | 1 | 1 | 0 | 1 | 0 | 0 |
| 1 | 1 | 0 | 1 | 1 | 0 | 1 | 1 | 0 | 0 |
| 1 | 1 | 1 | 0 | 1 | 0 | 1 | 1 | 0 | 0 |
| 1 | 1 | 1 | 1 | 1 | 0 | 1 | 1 | 1 | 0 |

Fig. 3B

METHOD FOR DETECTING CODE ERROR

BACKGROUND OF THE INVENTION

1. Field of the Invention

The present invention is related to a method for detecting a code error, and more particularly, to a method that is used to detect whether there is only a bit of error that exists in the accessed data.

2. Description of Related Art

Nowadays, the propagation of information is very fast. In the past, people usually used magnetic disks, such as floppy disks, to carry data. However, the storage capacity of magnetic disks is quite limited. Hence, when one needs to carry a great quantity of data, he has no choice but to use a hard disk or optical disk to carry the data. That is very inconvenient. With the rapid progress of computer science in recent years, in order to solve this problem, computer companies employed memories, such as flash memories, to develop a variety of memory cards or portable disks with various storage capacities. These memory cards or portable disks are compatible to portable electronic products such as notebook computers, personal digital assistants (PDA), cellular phones, digital cameras and the like. They have large storage capacity and can be used to store altogether MP3 files, picture files and important briefing files needed. Since this kind of memory cards or portable disks can be accessed with a high data transfer rate and easily carried, they are very convenient and practical. Hence, they are usually used in schools, offices, business travels and so forth at present. After this kind of storage media was introduced into the market, people don't need to use magnetic disks or hard disks to carry their data any more. Therefore, the inconvenience for carrying data in the past is removed completely.

Presently, in order to avoid the data transfer error of memories due to noise interference, the portable electronic apparatuses, such as card-reading machines, notebook computers, PDAs, cellular phones and digital cameras, usually have error-checking circuits. When the portable electronic apparatus needs to transfer data to a memory, it first uses the error-checking circuit to generate an error correction code (ECC) corresponding to the data and then store the data and the error correction code to the memory. On the contrary, when portable electronic apparatus needs to access the data stored in the memory, it first reads out the data together with the corresponding error correction code and then uses the error-checking circuit to generate another error correction code according to the read data. After that, the portable electronic apparatus compares the error correction code obtained from the memory with the new generated one to check whether the accessed data are correct or not. If these two error correction codes are exactly the same, it means the accessed data are correct completely. The steps of the conventional method are described in detail as below.

When the portable electronic apparatus compares the two error correction codes, it generates an error comparison code. The portable electronic apparatus can use this error comparison code to determine whether the accessed data are correct or not. If the accessed data are error, the portable electronic apparatus can also use this error comparison code to find the error type and set the Status bit accordingly. The portable electronic apparatus can use the Status bit to determine whether the error data can be corrected or not. If every bit of the error comparison code is "0", it means the two error correction codes are exactly the same and the accessed data are correct completely. If one bit of the error comparison code is "1", it means that there is an error bit existing in the accessed data. This error type is called code error and its corresponding data can be corrected.

In order to clarify the operation of the portable electronic apparatus about the error comparison code, a four-bit error comparison code is used as an example. First, for a four-bit error comparison code, there are four types of code errors: (0001), (0010), (0100) and (1000). Suppose that an apparatus, called the first apparatus, stores its ready data together with the corresponding error correction code (0101), called the first error correction code, into a memory. After that, another apparatus, called the second apparatus, reads out the data together with the corresponding error correction code (0101) and then generates another error correction code (0001), called the second error correction code, according to the data. Then, the second apparatus compares the first and second error correction codes so as to generate a corresponding error comparison code (0100). This error comparison code is the same as one type of the code errors mentioned above. It means that the data accessed from the memory have a one-bit error and can be corrected.

Most of the conventional apparatuses that can be used to access memories use electric circuits to perform the pattern comparison method to determine whether the error comparison code is the same as one type of the code errors or not. The so-called pattern comparison method is to provide all types of the code errors in advance and then compare the error comparison code with these code errors one by one. For example, for comparison of a four-bit error comparison code, the code errors including (0001), (0010), (0100) and (1000) should be provided in advance. Then, the four-bit error comparison code is compared with these code errors one by one to determine whether the error comparison code is the same as one of the code errors or not.

Although the pattern comparison method is a simple and direct method, it still has some problems. For example, if the code length of the error comparison code increases, i.e. the number of bits that it includes increases, more patterns of the code errors need to be provided in this method. At the same time, the size of the comparison circuit needed also becomes larger. It makes the complexity of the comparison circuit and the number of the electric components increased. Besides, the time consumed for comparison with the code errors will also become longer. In practice, the comparison circuit used for a N-bit error comparison code must have N comparators and N−1 OR gates.

Therefore, how to provide a method for determining the code error type of accessed data to remove the drawbacks of the prior art has been desired for a long time. Accordingly, the present invention provides a method to efficiently detect whether there is a one-bit error existing in the accessed data so as to solve the foresaid problem. Furthermore, the present invention can reduce the number of detecting components disposed on a circuit board of the host computer. Hence, the area of the circuit board occupied by the detecting components is reduced.

SUMMARY OF THE INVENTION

An objective of the present invention is to provide a method for detecting a code error. It first adds up each bit of the error comparison code to obtain a summation value. Then, the present invention checks the summation value to find whether there is any carrying operation occurring in the addition process and whether the summation value is equal to "1". Thereby, the present invention can speedily determine whether the error comparison code is the same as one of the code errors or not. If no carrying operation occurs in the addition process and the summation value is "1", the present invention determines that the error comparison code is the same as one of the code errors. In this way, the present invention can reduce the time consumption of error detection and improve the detection efficiency.

Another objective of the present invention is to provide a method for detecting a code error that uses a simple logic circuit to add up each bit of the error comparison code and obtain a summation value thereby. The present invention checks the summation value to find whether there is a carrying operation occurring in the addition process and whether the summation value is equal to "1". Thereby, the present invention can determine whether the error comparison code is the same as one of the code errors or not. In this way, the present invention can reduce the complexity and the size of the circuit, and also can reduce the cost.

For achieving the objectives above, the present invention provides a method for detecting a code error. The method is mainly applied for a host computer capable of accessing a storage device. By using the present invention, the host computer can easily check whether there is only an error bit existed in the data accessed from the storage device. After the data are accessed, the method generates an error comparison code, wherein the error comparison code has a plurality of bits. Then, the method adds up each bit of the error comparison code to provide a summation value. After that, the method checks whether a carrying operation occurs in the step of adding up the bits of the error comparison code and checks whether the summation value is equal to "1" when no carrying operation occurs. If no carrying operation occurs and the summation value is equal to "1", the present invention determines that there is only an error bit existed in the accessed data, and thereby is a code error.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 2B is a truth table of the logic circuit in accordance with the first preferred embodiment of the present invention;

FIG. 3B is a truth table of the logic circuit in accordance with the second preferred embodiment of the present invention.

DETAILED DESCRIPTION OF PREFERRED EMBODIMENTS

The concept of the present invention is to add up the value of every bit of the error comparison code to obtain a summation. In the addition process, the present invention checks whether a carrying operation occurs and checks whether the summation is equal to "1", and then determines that whether there is only an error bit existed in the accessed data of a storage device, such as EEPROM or flash memory.

Figure 1A:
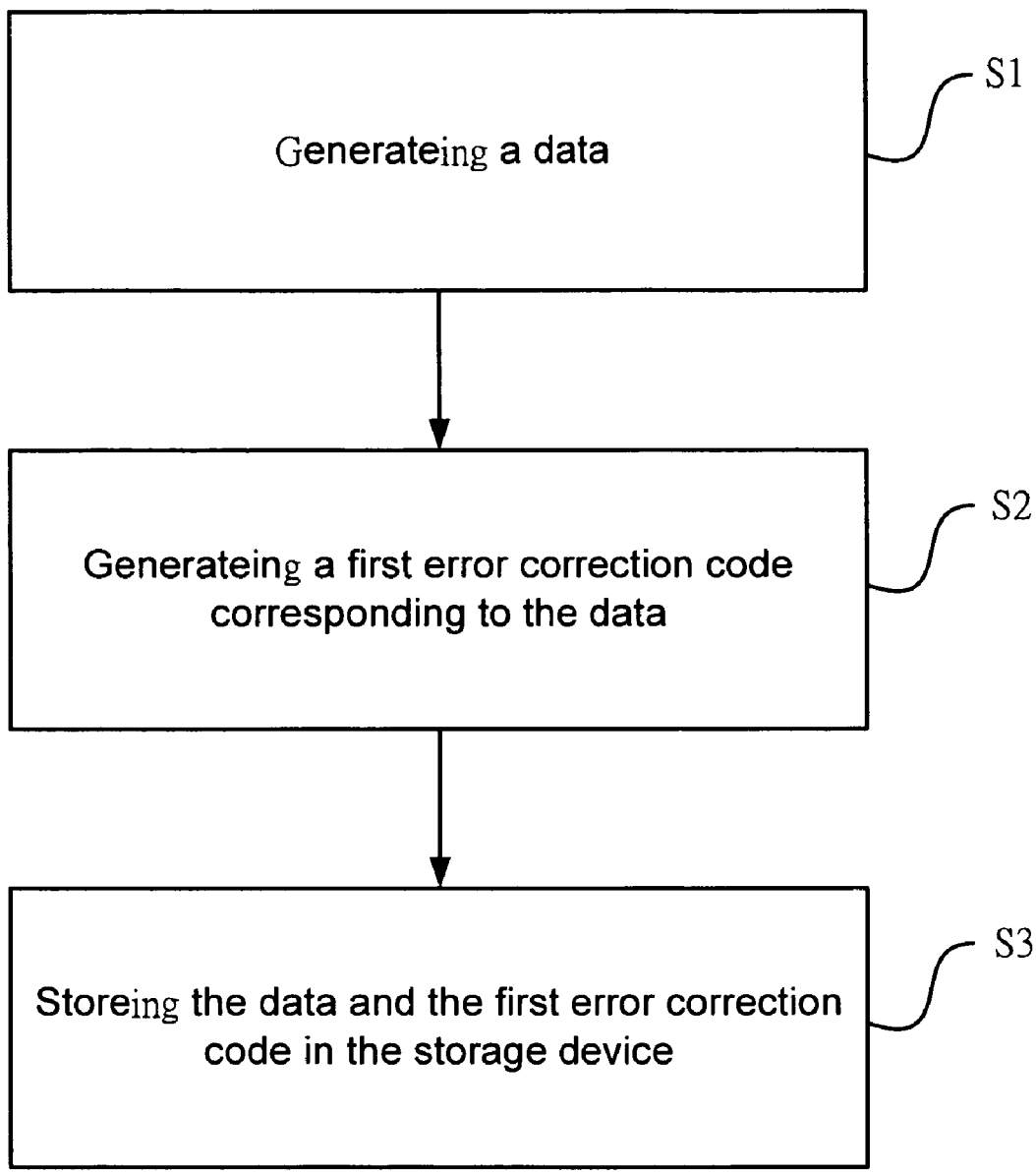
FIG. 1A is a flow chart for writing data into a storage device in accordance with the present invention.

Reference is made to FIG. 1A, which is a flow chart showing how data are stored into a storage device in accordance with the present invention. As shown in the figure, in step S1, a host computer generates a data that need to be stored in a storage device. Then, in step S2, the host computer generates a first error correction code (ECC) corresponding to the data. After that, in step S3, the data and the first error correction code are stored in the storage device.

Figure 1B:
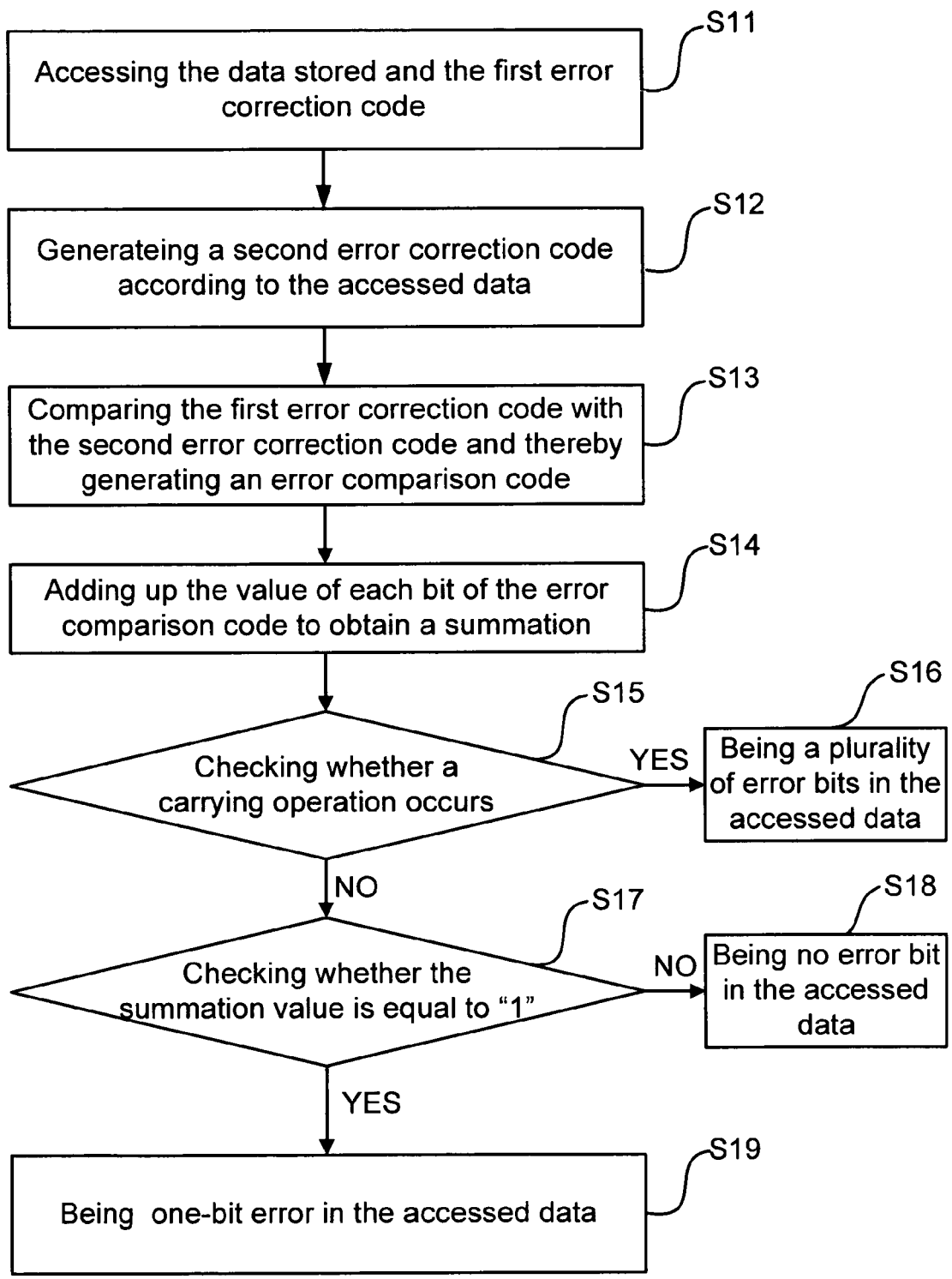
FIG. 1B is a flow chart for detecting the data accessed from the storage device in accordance with the present invention.

Reference is made to FIG. 1B. When another host computer accesses the data stored in the storage device it also accesses the first error correction code (step S11). Then, the host computer generates a second error correction code according to the accessed data (step S12). After that, the first error correction code is compared with the second error correction code and thereby generates an error comparison code, which has multiple bits, is provided (step S13).

The present invention is developed according to the feature of code errors, i.e. each code error only has one bit equal to "1" and all of the other bits of the code error are equal to "0". Hence, by adding up the value of each bit of the code error, a summation that equals to "1" is obtained. Besides, there is no carrying operation occurring in the step of adding up the binary digits. By using this feature, the present invention can check whether the error comparison code is a code error and thereby check whether there is an error bit only or a plurality of error bits.

In accordance with the above-mentioned description, when step S13 is performed, the host computer can check whether there is an error bit only. As shown in step S14, the host computer adds up the value of each bit of the error comparison code to obtain a summation. For example, if the error comparison code is (0001), "0", "0", "0" and "1" are added up orderly. In this example, no carrying operation occurs and the summation is equal to "1". In another example, if the error comparison code is (1001), according to the method of binary addition, a carrying operation occurs in the step of adding up the binary digits and the summation is equal to "0".

Subsequently, as shown in step S15, the host computer checks whether a carrying operation occurs. If there is a carrying operation that occurs in the step of adding up the binary digits, as shown in step S16, it means that there are a plurality of error bits. The above-mentioned example that the error comparison code is (1001) belongs to this case. If there is no carrying operation that occurs in the step of adding up the binary digits, step S17 is performed to check whether the summation value is equal to "1". If the summation is not equal to "1", as shown in step S18, it means that there is no error bit existed in the accessed data. However, if the summation is equal to "1", as shown in step S19, it means that there is a one-bit error in the accessed data, and the corresponding error comparison code is a code error.

Figure 2A:
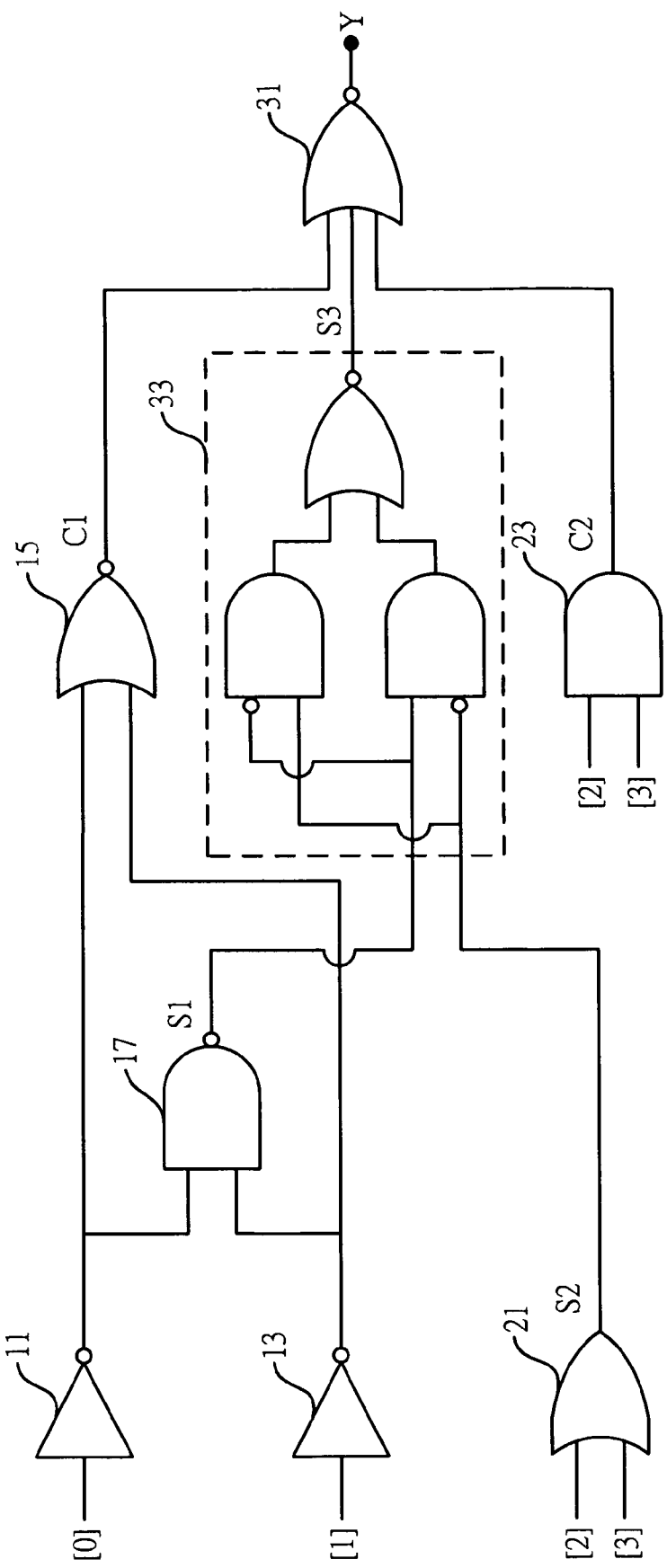
FIG. 2A is a diagram of a logic circuit in accordance with the first preferred embodiment of the present invention.

Reference is made to FIGS. 2A and 2B. FIG. 2A is a diagram of a logic circuit in accordance with a preferred embodiment of the present invention and FIG. 2B is a truth table of the logic circuit. This embodiment is an example for four-bit error comparison code of the accessed flash memory data, wherein the flash memory is a memory card. As shown in FIG. 2A, the error comparison code includes a first bit [0], a second bit [1], a third bit [2], and a fourth bit [3]. The first bit [0] and the second bit [1] of the error comparison code are inputted to the NOT gates 11 and 13, respectively. Then, the outputs of the NOT gates 11 and 13 are inputted to a NOR gate 15. The output C1 of the NOR gate 15 can be used to show whether there is a carrying operation or not when the first bit [0] is added with the second bit [1] because the combination of the NOT gates 11, 13 and the NOR gate 15 is equal to an AND gate (output C1=1 means that a carrying operation occurs and output C1=0 means that no carrying operation occurs).

The third bit [2] and the fourth bit [3] of the error comparison code are inputted to an OR gate 21 and an AND gate 23. The output C2 of the AND gate 23 can be used to show whether there is a carrying operation or not when the third bit [2] is added with the fourth bit [3] (output C2=1 means that a carrying operation occurs and output C2=0 means that no carrying operation occurs). The output C1 of the NOR gate 15 and the output C2 of the AND gate 23 are both inputted to a NOR gate 31. The output Y of the NOR gate 31 represents whether the error comparison code of the accessed flash memory data is the same as one of the code errors or not. If the output Y of the NOR gate 31 is "1", it means "yes". Otherwise, if the output Y of the NOR gate 31 is "0", it means "no". If there is a carrying operation occurring in the addition process of the first bit [0] and the second bit [1] or of the third bit [2] and the fourth bit [3], the output C1 of the NOR gate 15 or the output C2 of the AND gate 23 will be "1". At either situation, the output Y of the NOR gate 31 will be "0", which means that the error comparison code is not the same as any one of the code errors.

Furthermore, except for detecting whether there is any carrying operation occurring in the addition process, the logic circuit is also used to determine whether the summation value is "1". The summation value of the first bit [0] and the second bit [1] is represented by the output S1 of the NAND gate 17. The two input ends of the NAND gate 17 are respectively connected to the NOT gates 11, 13. Hence, the input values of the NAND gate 17 are the inverse values of the first bit [0] and the second bit [1]. The functionality of the combination of the NAND gate 17 and the NOT gates 11, 13 is equal to an OR gate. Hence, in case the values of the first bit [0] and the second bit [1] are both equal to "1", the output S1 of the NAND gate 17 will be "1", which is not a correct value to represent the summation of the first bit [0] and the second bit [1] because the correct value is "0" according to the method of binary addition. At the same time, the output C1 of the NOR gate 15 must be "1" (it means a carrying operation occurs).

In accordance with the description above, when the first bit [0] and the second bit [1] are both equal to "1", the output S1 of the NAND gate 17 is not equal to the correct summation value, i.e. "0". However, since there is a carrying operation occurring during the addition process, i.e. C1=1, the output Y of the NOR gate 31 is equal to "0", which means that the error comparison code is not the same as any one of the code errors. As shown in the truth table, when the first bit [0] and the second bit [1] are both equal to "1", C1=1 and Y=0. Therefore, even though the summation value S1 is incorrect when the first bit [0] and the second bit [1] are both equal to "1", it doesn't affect the final result of the present invention.

Similarly, the summation value of the third bit [2] and the fourth bit [3] can be represented by the output S2 of the OR gate 21 if the values of these two bits are not equal to "1" at the same time. As the discussion above, when the values of the third bit [2] and the fourth bit [3] are both equal to "1", the output S2 of the OR gate 21 is "1", not the correct value, i.e. "0", in accordance with the method of binary addition. However, the output C2 of the AND gate 23 will be "1", which means a carrying operation occurs during the addition process. That will make the value of the output Y of the NOR gate 31 equal to "0", which means that the error comparison code is not the same as any one of the code errors. Therefore, even though the summation value S2 is incorrect when the third bit [2] and the fourth bit [3] are both equal to "1", it doesn't affect the final result of the present invention. As shown in the truth table, when the third bit [2] and the fourth bit [3] are both equal to "1", C2=1 and Y=0.

As shown in FIG. 2A, the summation values S1 and S2 are inputted to an EXCLUSIVE NOR gate 33. The output S3 of the EXCLUSIVE NOR gate 33 are inputted to the NOR gate 31. When the summation values S1 and S2 are not the same, it means that only one of the summation values S1 and S2 is "1" and the other is "0". In this situation, the value of the output S3 of the EXCLUSIVE NOR gate 33 is equal to "0". As shown in the truth table, when S1=1, S2=0 (or S1=0, S2=1), S3=0. At this time, if the values of C1 and C2 are both equal to "0", i.e. all of the input values of the NOR gate 31 (namely C1, S3, and C2) are equal to "0", the output value Y of the NOR gate 31 will be "1", which means that the error comparison code is the same as one of the code errors. Therefore, the value of the output Y can be used to provide the Status bit to inform the host computer that the accessed data only have an error bit and can be corrected. As shown in the truth table, when S3=0, C1=0, and C2=0, Y=0, which means that the error comparison code is the same as one of the code errors.

Figure 3A:
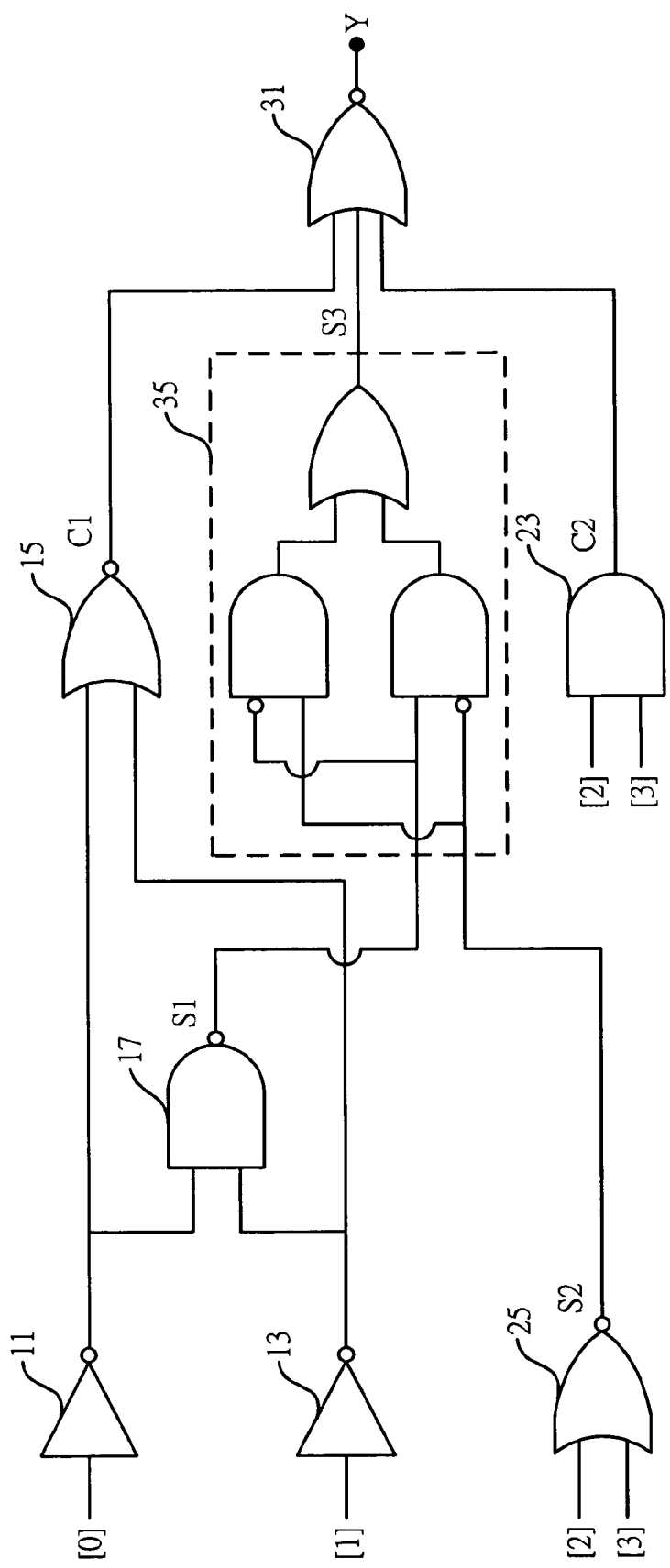
FIG. 3A is a diagram of a logic circuit in accordance with the second preferred embodiment of the present invention.

Reference is made to FIGS. 3A and 3B. FIG. 3A is a diagram of a logic circuit in accordance with another preferred embodiment of the present invention and FIG. 3B is a truth table of the logic circuit. The difference between this embodiment and the previous embodiment is that this embodiment inputs the third bit [2] and the fourth bit [3] of the error comparison code into a NOR gate 25. The output S2 of the NOR gate 25 represents the summation of the third bit [2] and the fourth bit [3]. The output S1 of the NAND gate 17 and the output S2 of the NOR gate 25 are inputted to an EXCLUSIVE OR gate 35. The output S3 of the EXCLUSIVE OR gate 35 is inputted to the NOR gate 31. As shown in the truth table, the value of output S3 of the EXCLUSIVE OR gate 35 is the same as that of the EXCLUSIVE NOR gate 33 in the previous embodiment.

In this embodiment, using the NOR gate 25 to add up the values of the third bit [2] and the fourth bit [3] always obtains a summation value opposite to the correct summation value obtained according to the method of binary addition, except that the values of the third bit [2] and the fourth bit [3] are both equal to "1". As shown in the truth table, when the third bit [2] is equal to "0" and the fourth bit [3] is equal to "0", the output S2 of the NOR gate 25 is equal to "1", which is opposite to the correct summation value, i.e. "0", obtained according to the method of binary addition. When the third bit [2] is equal to "0" and the fourth bit [3] is equal to "1" (or the third bit [2] is equal to "1" and the fourth bit [3] is equal to "0"), the output S2 of the NOR gate 25 is equal to "0", which is opposite to the correct summation value, i.e. "1", obtained according to the method of binary addition.

However, the output S1 of the NAND gate 17 and the output S2 of the NOR gate 25 are inputted to the EXCLUSIVE OR gate 35 and the operation of the EXCLUSIVE OR gate 35 is logically opposite to that of the EXCLUSIVE NOR gate 33 mentioned in the previous embodiment. It means that the output S3 of the EXCLUSIVE OR gate 35 is "0" when the values of S1 and S2 are the same. Because that the value of S2 is always opposite to the correct value, the output S3 of the EXCLUSIVE OR gate 35 shown in the truth table of this embodiment is the same as the output of the EXCLUSIVE NOR gate 33 of the previous embodiment. As shown in the truth table of this embodiment, when all of the values of the C1, S3 and C2 inputted to the NOR gate 31 are "0", the output Y of the NOR gate 31 is "1". It means that no carrying operation occurs when from the first bit [0] to the fourth bit [3]

of the error comparison code are added up and the summation value is equal to "1". In this case, the error comparison code is the same as one of the codes errors.

As the description of the two embodiments mentioned above, the comparison circuit of the present invention can be implemented by using simple logic circuits. In this way, the present invention can easily and efficiently check whether the error comparison code is the same as one of the code errors and thereby determine whether the accessed data only have an error bit. After that, the present invention can provide a Status bit to inform the host computer to correct the accessed data.

Summing up, the present invention provides a method for detecting a code error, which is applied for a host computer to access data from a storage device. Using the present invention can fast and efficiently check whether the accessed data only have an error bit. After the data are accessed, the detecting method of the present invention first generates an error comparison code corresponding to the accessed data. Then, it adds up the value of each bit of the error comparison code. The present invention first checks whether any carrying operation occurs in the addition process and then checks whether the summation value is equal to "1". If the summation value is "1" and no carrying operation occurs in the addition process, the present invention determines that the error comparison code is the same as one of the code errors. It means the accessed data is error and only have an error bit. By using the present invention, the code errors can be detected speedily and the number of the components used for detection and the area occupied by these components are reduced.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A method for detecting code error, comprising:
   accessing data from a storage device and a first error correction code corresponding to the data;
   generating a second error correction code corresponding to the accessed data;
   comparing the first error correction code with the second error correction code to generate an error comparison code, wherein the error comparison code has a plurality of bits;
   adding up each bit of the error comparison code to provide a summation value; and
   checking whether a carrying operation occurs in the step of adding up the bits of the error comparison code and checking whether the summation value is equal to "1" when no carrying operation occurs.

2. The method as claimed in claim 1, wherein, in the step of checking whether the summation value is equal to "1" when no carrying operation occurs, the method determines that there is only an error bit existed in the accessed data when the summation value is equal to "1".

3. The method as claimed in claim 1, wherein, in the step of checking whether the summation value is equal to "1" when no carrying operation occurs, the method determines that there is no error bit existed in the accessed data when the summation value is not equal to "1".

4. The method as claimed in claim 1, wherein, in the step of adding up each bit of the error comparison code, the method uses a plurality of adders to add up the bits of the error comparison code to provide the summation value.

5. The method as claimed in claim 1, wherein the storage device is a flash memory.

6. The method as claimed in claim 5, wherein flash memory is a memory card.

7. A method for detecting code error, comprising:
   accessing data and generating an error comparison code corresponding to the data, wherein the error comparison code has a plurality of bits;
   adding up each bit of the error comparison code to provide a summation value; and
   checking whether a carrying operation occurs in the step of adding up the bits of the error comparison code and checking whether the summation value is equal to "1" when no carrying operation occurs.

8. The method as claimed in claim 7, wherein, in the step of checking whether the summation value is equal to "1" when no carrying operation occurs, the method determines that there is only an error bit existed in the accessed data when the summation value is equal to "1".

9. The method as claimed in claim 7, wherein, in the step of checking whether the summation value is equal to "1" when no carrying operation occurs, the method determines that there is no error bit existed in the accessed data when the summation value is not equal to "1".

10. The method as claimed in claim 7, wherein, in the step of adding up each bit of the error comparison code, the method uses a plurality of adders to add up the bits of the error comparison code to provide the summation value.

11. The method as claimed in claim 7, wherein, in the step of accessing the data and generating the error comparison code corresponding to the data, the method access the data from a storage device.

12. The method as claimed in claim 11, wherein the storage device is a flash memory.

13. A method for detecting code error, used after data are accessed, the data having an error comparison code with multiple bits, the method comprising:
   adding up each bit of the error comparison code to provide a summation value; and
   checking whether a carrying operation occurs in the step of adding up the bits of the error comparison code and checking whether the summation value is equal to "1" when no carrying operation occurs.

14. The method as claimed in claim 13, wherein, in the step of checking whether the summation value is equal to "1" when no carrying operation occurs, the method determines that there is no error bit existed in the accessed data when the summation value is not equal to "1".

15. The method as claimed in claim 13, wherein, in the step of checking whether the summation value is equal to "1" when no carrying operation occurs, the method determines that there is only an error bit existed in the accessed data when the summation value is equal to "1".

* * * * *